(12) United States Patent
Ohno et al.

(10) Patent No.: US 7,532,479 B2
(45) Date of Patent: May 12, 2009

(54) SPREAD ILLUMINATING APPARATUS

(75) Inventors: Yasuo Ohno, Kitasaku-gun (JP); Chiharu Ota, Kitasaku-gun (JP)

(73) Assignee: Minebea Co., Ltd., Kitasaku (JP)

( * ) Notice: Subject to any disclaimer, the term of this patent is extended or adjusted under 35 U.S.C. 154(b) by 0 days.

(21) Appl. No.: 11/707,884

(22) Filed: Feb. 20, 2007

(65) Prior Publication Data

US 2007/0201247 A1    Aug. 30, 2007

(30) Foreign Application Priority Data

Feb. 28, 2006    (JP)    ............................ 2006-052264

(51) Int. Cl.
*H05K 7/20*    (2006.01)

(52) U.S. Cl. ................... 361/719; 257/706; 257/712; 361/720; 362/631

(58) Field of Classification Search ................ 362/612, 362/611, 561, 555; 361/708, 709, 820
See application file for complete search history.

(56) References Cited

U.S. PATENT DOCUMENTS

| | | | | |
|---|---|---|---|---|
| 5,285,352 | A * | 2/1994 | Pastore et al. | 361/707 |
| 5,756,380 | A * | 5/1998 | Berg et al. | 438/126 |
| 5,856,911 | A * | 1/1999 | Riley | 361/704 |
| 5,857,767 | A * | 1/1999 | Hochstein | 362/294 |
| 5,870,289 | A * | 2/1999 | Tokuda et al. | 361/779 |
| 5,923,084 | A * | 7/1999 | Inoue et al. | 257/712 |
| 6,045,240 | A * | 4/2000 | Hochstein | 362/294 |
| RE36,773 | E * | 7/2000 | Nomi et al. | 361/760 |
| 6,107,679 | A * | 8/2000 | Noguchi | 257/678 |
| 6,190,941 | B1 * | 2/2001 | Heinz et al. | 438/106 |
| 6,282,094 | B1 * | 8/2001 | Lo et al. | 361/704 |
| 6,477,054 | B1 * | 11/2002 | Hagerup | 361/720 |
| 6,517,218 | B2 * | 2/2003 | Hochstein | 362/294 |
| 6,686,667 | B2 * | 2/2004 | Chen et al. | 257/787 |
| 6,806,583 | B2 * | 10/2004 | Koay et al. | 257/787 |
| 6,834,977 | B2 * | 12/2004 | Suehiro et al. | 362/187 |
| 6,920,046 | B2 * | 7/2005 | Spryshak | 361/704 |
| 6,929,975 | B2 * | 8/2005 | Heinz et al. | 438/106 |
| 6,969,188 | B2 * | 11/2005 | Kuo | 362/613 |
| 7,026,664 | B2 * | 4/2006 | Divakar et al. | 257/107 |
| 7,175,329 | B1 * | 2/2007 | Chou | 362/612 |
| 7,196,459 | B2 * | 3/2007 | Morris | 313/46 |

(Continued)

FOREIGN PATENT DOCUMENTS

JP    A 11-121805    4/1999

(Continued)

*Primary Examiner*—Bao Q. Truong
*Assistant Examiner*—Gunyoung T. Lee
(74) *Attorney, Agent, or Firm*—Oliff & Berridge, PLC

(57) ABSTRACT

In a spread illuminating apparatus including: an LED at a side surface of a light conductor plate; and an FPC having a land formed on a side thereof for mounting the LED, throughholes are formed at the land, and solder is contained at least partly in each of the throughholes, whereby the LED can be mounted solidly on the FPC with a high precision in height position from the FPC, and at the same time the heat emitted from the LED can be efficiently conducted to a conductive pattern at the rear side of the FPC through an electrode terminal of the LED and the throughholes filled with the solder composed of a metallic material having a high heat conductance.

3 Claims, 3 Drawing Sheets

U.S. PATENT DOCUMENTS

| | | | |
|---|---|---|---|
| 7,381,905 B2 * | 6/2008 | Yoshioka | 174/262 |
| 2004/0027067 A1 * | 2/2004 | Song et al. | 313/512 |
| 2005/0117319 A1 * | 6/2005 | Kuo | 362/31 |
| 2007/0081340 A1 * | 4/2007 | Chung et al. | 362/294 |
| 2007/0217202 A1 * | 9/2007 | Sato | 362/294 |
| 2008/0043444 A1 * | 2/2008 | Hasegawa et al. | 361/717 |

FOREIGN PATENT DOCUMENTS

| | | |
|---|---|---|
| JP | A 2002-162626 | 6/2002 |
| JP | A 2002-171042 | 6/2002 |
| JP | A 2003-076287 | 3/2003 |
| JP | A 2005-038771 | 2/2005 |
| JP | A 2005-280903 | 10/2005 |

\* cited by examiner

SPREAD ILLUMINATING APPARATUS

BACKGROUND OF THE INVENTION

1. Field of the Invention

The present invention relates to a side light type spread illuminating apparatus, and more particularly to a spread illuminating apparatus used as a lighting means for a liquid crystal display device.

2. Description of the Related Art

A side light type spread illuminating apparatus, in which a primary light source is disposed at a side surface of a light conductor plate, is predominantly used as a lighting means for a liquid crystal display (LCD) device used in a mobile telephone, and like devices. Conventionally, the primary light source has been constituted by a cold cathode lamp. Currently, a point light source, such as a white light emitting diode (LED), which is easier to handle, enables easier downsizing, and is more resistant to impact shock than the cold cathode lamp, is heavily used. The application of a spread illuminating apparatus using such a point light source is expanding beyond usage in a small LCD device for a mobile telephone, and is now considered for usage in a relatively large LCD device for a car navigation system.

In order to satisfactorily cover an increased illumination area in an enlarged LCD device, it is desirable to apply an increased current to the point light source thereby increasing the amount of light emitted from the point light source. The increased current applied to the point light source, however, causes an increase of heat thus raising temperature, which lowers the luminous efficiency of the point light source.

To overcome such a problem, various methods are considered to efficiently allow heat generated by the point light source to escape outside. For example, a spread illuminating apparatus 1 shown in FIG. 5 includes a light conductor plate 2, LEDs 3 as point light sources mounted on a flexible printed circuit board (hereinafter, referred to as FPC as appropriate) 4 and disposed at a side surface (light inlet surface) 2a of the light conductor plate 2, and a frame 5 adapted to hold together the components described above and made of a metallic material having an excellent heat conductance, e.g., aluminum. In the spread illuminating apparatus 1 as described above, in order to more efficiently release heat outside, a mechanism for radiating heats from the LEDs 3 is disclosed which is structured such that holes are formed through both the FPC 4 and a heat radiating plate 5a made of metal and disposed behind the FPC 4, and adhesive filling material of high heat conductivity is put in the holes (refer to, for example, Japanese Patent Application Laid-Open No. 2002-162626). In such a heat radiating mechanism, the bottom face of a point light source, which is a package surface located closest to a light emitting portion to most generate heat, is connected to a metallic frame to support the point light source by means of adhesive filling material having a higher heat conductance than an FPC, whereby heat radiation characteristic is enhanced.

In the heat radiating mechanism described above, the heat generated by the point light source mounted on the FPC is conducted generally through electrode terminals of the point light sources, electrical conductors of the FPC, and a base material (for example, a base film) of the FPC before getting to the rear surface of the FPC and then to the heat radiating plate connected to the rear surface of the FPC, thus failing to provide an adequate heat radiating pathway to efficiently radiate the heat emitted from the point light source and also failing to provide a sufficient area for direct radiation. Especially, in case of a large current LED, a large amount of heat is emitted from its package, thus aggravating the heat problem.

Also, in a conventional spread illuminating apparatus, it may possibly happen that a point light source mounted on an FPC is lifted off due to solder applied to a land. For achieving a favorable coupling efficiency between a light conductor plate and a point light source, it is required that the point light source be precisely positioned relative to the light conductor plate with respect to two directions oriented orthogonal respectively to a major surface and a light inlet surface of the light conductor plate. If the lift-off problem occurs in the spread illuminating apparatus 1 shown in FIG. 5, variation is caused in the height position of the LEDs 3 from the FPC 4, in which case the coupling efficiency is decreased regardless of the FPC 4 arranged parallel to the light inlet surface 2a of the light conductor plate 2 (as shown in FIG. 5) or arranged orthogonal thereto. Under the circumstances described above, a point light source is becoming smaller and smaller in dimension thus making its effective mounting area smaller, and therefore it is becoming important to increase the mounting strength of a point light source for the purpose of securing a stable optical coupling efficiency over a long period of time. Consequently, it is requested to resolve deficiency in strength for mounting a point light source.

SUMMARY OF THE INVENTION

The present invention has been made in light of the above problems, and it is an object of the present invention to provide a spread illuminating apparatus in which a point light source can be mounted on an FPC precisely and solidly, and heat from the point light source is efficiently radiated.

In order to achieve the object described above, according to an aspect of the present invention, there is provided a spread illuminating apparatus which includes: a light conductor plate; a point light source disposed at a side surface of the light conductor plate; and a printed circuit board having a land formed on one side thereof and having the point light source mounted on the one side. In the spread illuminating apparatus described above, the point light source is attached to the land, a throughhole is formed at the land, and solder is contained at least partly in the throughhole. Accordingly, heat emitted from the point light source is conducted to the rear side of the printed circuit board through the electrode terminals of the point light source, and the throughhole formed at the land and containing the solder, thus providing an efficient heat radiation pathway.

In the aspect of the present invention, the solder contained in the throughhole may be preferably filled thereinto during a heating process implemented by a heating reflow soldering method. This way, at the time of mounting the point light source on the printed circuit board, solder melted is adapted to flow into the throughhole sucking in the electrode terminal of the point light source placed on the land due to the interfacial tension, whereby a sufficiently and uniformly thinned solder layer is formed between the electrode terminal of the point light source and the land of the printed circuit board. Thus, the point light source can be mounted securely on the printed circuit board with a high precision in height position from the printed circuit board, and at the same time a gap (air space) between the mounting face of the point light source and the printed circuit board is reduced thereby further enhancing heat radiation efficiency.

In the aspect of the present invention, the printed circuit board may be a double-sided printed circuit board which defines a front side having the point light source and a rear side opposite to the front side, and a conductive pattern section of a conductive pattern on the rear side may be preferably formed at at least an area of the rear side having the throughhole and communicate with a plated coating provided at the wall of the throughhole. With this structure, the heat conducted to the rear side of the printed circuit board can be further efficiently radiated.

In the aspect of the present invention, a recess may be formed at a portion on the front side of the printed circuit board, the bottom of the recess may be constituted by a portion of the conductive pattern at the rear side, and heat conductive rein may be filled in a space defined by the recess and the mounting face of the point light source. Accordingly, the heat emitted from the point light source can be radiated more efficiently. This structure with a recess is especially favorable with use of a flexible printed circuit board (FPC) compared to a structure with a throughhole, in that the strength of the FPC is not deteriorated. Also, with this structure, the gap between the mounting face of the point light source and the printed circuit board is made thin and uniform, and therefore the amount of the heat conductive resin can be easily controlled thereby enabling the heat conductive resin to surely make contact with the mounting face of the point light source.

Thus, according to the present invention, a spread illuminating apparatus can be provided in which heat from a point light source can be efficiently radiated and also the point light source can be precisely and solidly mounted on a printed circuit board. Consequently, the brightness can be further enhanced and uniformed while the profile is successfully reduced.

DETAILED DESCRIPTION OF THE INVENTION

Figure 5:
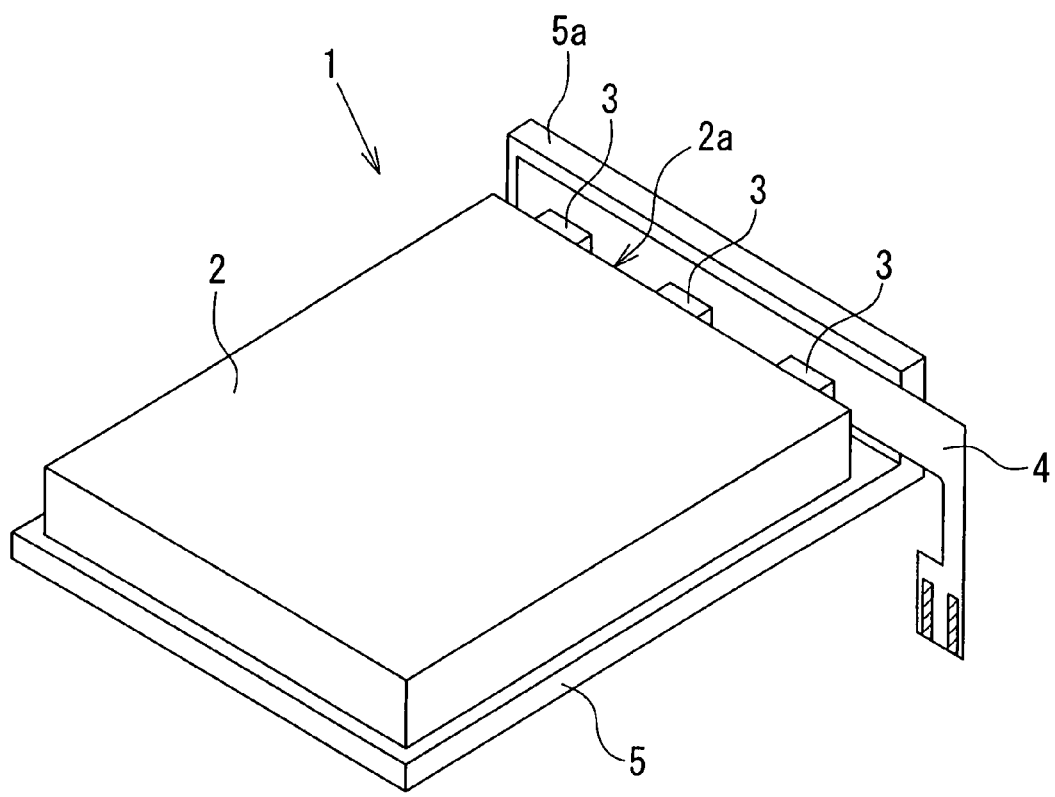
FIG. 5 is a perspective view of a conventional spread illuminating apparatus.

Exemplary embodiments of the present invention will hereinafter be described with respect to the accompanying drawings. It is to be noted that the drawings are for illustration and may not necessarily reflect actual configurations and dimensions correctly. Also, since spread illuminating apparatuses according to the exemplary embodiments of the present invention are of side light type and have the same basic structure as the spread illuminating apparatus 1 shown in FIG. 5, like reference numerals refer to like elements throughout the description and drawings, and redundant explanations will be omitted as appropriate while description is focused on the structure of a light source and its vicinity, which is a key feature of the present invention.

A spread illuminating apparatus according to a first embodiment of the present invention will be described with reference to FIGS. 1 and 2.

Figure 1:
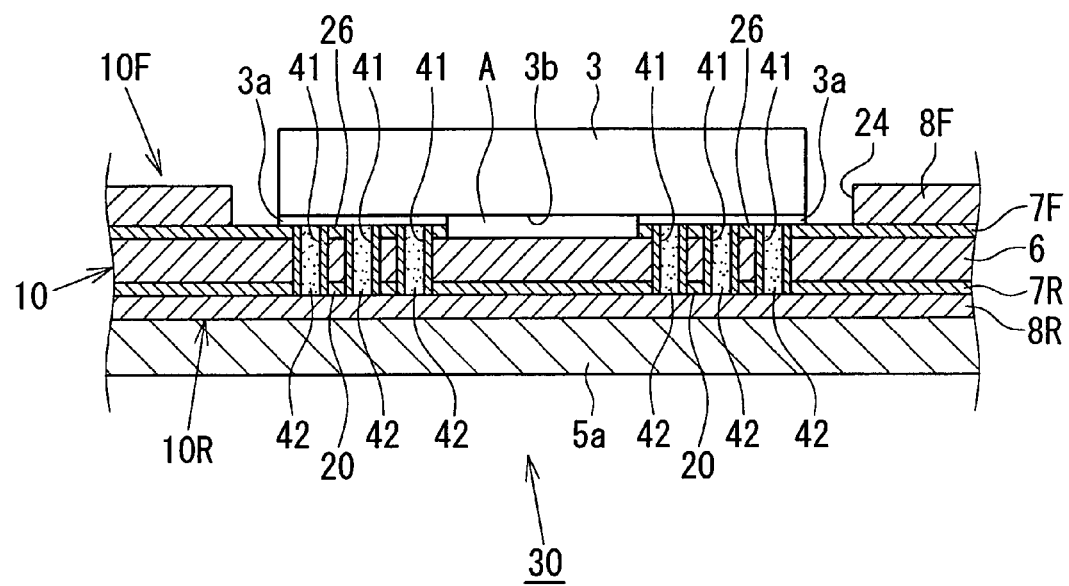
FIG. 1 is a cross sectional view of a point light source and a relevant portion of a double-sided FPC in a spread illuminating apparatus according to a first embodiment of the present invention.
Figure 2:
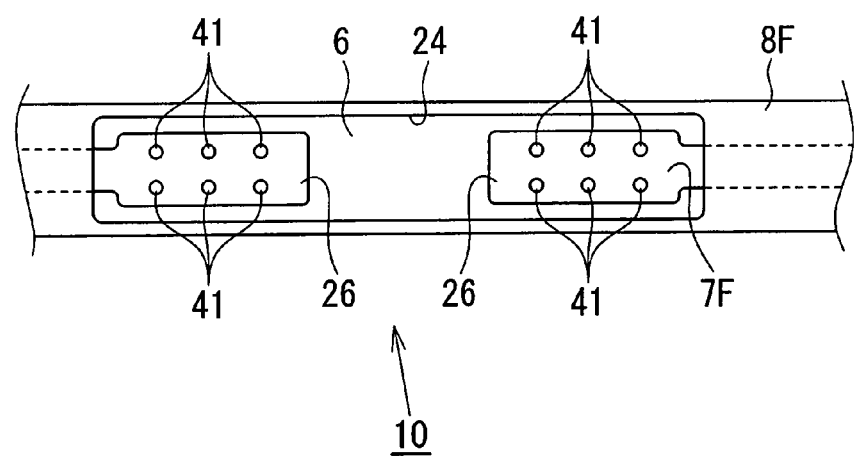
FIG. 2 is a top plan view of the double-sided FPC shown in FIG. 1, removing the point light source.

FIG. 1 shows a light source region (point light source and its vicinity) 30 of the spread illuminating apparatus according to the first embodiment, and FIG. 2 shows a relevant portion of a double-sided flexible printed circuit board (hereinafter referred to as FPC) 10. Referring to FIG. 1, the FPC 10 includes a base film 6 made of polyimide or the like, conductive patterns 7F and 7R made of copper foil, layered respectively on the front and rear surfaces of the base film 6 and patterned, and cover films 8F and 8R made of polyimide or the like and layered on the conductive patterns 7F and 7R, respectively.

Lands 26, to which a white LED (hereinafter referred to simply as LED) 3 as a point light source is attached when mounted on the FPC 10, are provided at the conductive pattern 7F on a front side 10F of the FPC 10. A plurality of throughholes 41 which each have a plated coating on its inner wall surface are formed in each of the lands 26, and solder 42 filled during a heating process (described later) is contained in each of the throughholes 41. On a rear side 10R of the FPC, a conductive pattern section 20 as a part of the conductive pattern 7R is formed at at least an area provided with the throughhole 41 and communicates with the plated coating of the throughhole 41. Though not illustrated, a solder layer is formed between an electrode terminal 3a of the LED 3 and the land 26, and the LED 3 is mounted on the FPC 10 such that the electrode terminal 3a is connected to the land 26 via the solder layer.

An opening 24 is formed at the cover film 8F on the front side 10F so as to expose at least the lands 26 as shown in FIG. 2, and the rear side 10R is fixedly attached to a heat radiating plate 5a such that a heat conductive tape (not shown) or the like is placed between the cover film 8R and the heat radiating plate 5a. Though the present invention can be duly carried out with or without provision of the heat radiating plate 5a and the heat conductive tape, or regardless of mode and configuration thereof, the heat radiating plate 5a may be preferably made of metal with a high heat conductance, such as aluminum, and the heat conductive tape may be preferably made of a heat conductive resin composition formed into a tape configuration, adapted to stably stay in a sold state at least at a room temperature, and having a considerable stickiness or adhesiveness and thickness flexibility. Specifically, the heat conductive tape may be made of exfoliated polyethylene terephthalate film or the like coated with acrylic resin composition. Also, the heat conductive tape may be made of resin composition adapted to soften or fuse at a high temperature, whereby thermal resistance at the contact area between the FPC 10 and the heat radiating plate 5a can be further reduced when the LED 3 emits heat.

In the light source region 30 according to the first embodiment, the rear side 10R of the FPC 10 is covered by a heat conductive tape with electrical insulation, so if the conductive pattern 7R is duly protected and insulated by provision of such a heat conductive tape, the cover film 8R at the rear side 10R may be thinner than the cover film 8F at the front side 10F, or may be even eliminated.

Description will now be made on a preferable manufacturing method of the light source region 30 of the first embodiment. The throughholes 41 at the land 26, together with other throughholes necessary for electric conduction, are formed at a copper layer substrate composed of copper foils layered on the both sides of the base film 6 made of polyamide or the like, and the conductive patterns 7F and 7R are formed by an etching method or like technique. Then, the cover film 8F, and the cover film 8R (if required), which are prepared with a predetermined geometry, are laminated respectively on the conductive patterns 7F and 7R by a thermal compression method or like technique, thus the FPC 10 is completed.

The LED 3 is mounted onto the FPC 10 by a heating reflow soldering method. Specifically, cream solder in paste form is applied to the land 26 at which the throughholes 41 are formed, and the LED 3 is placed on two of the lands 26 such that the electrode terminals 3a of the LED 3 are set at respective predetermined positions of the lands 26. The FPC 10 with the LED 3 set thereon is heated by a reflow soldering apparatus thereby melting the cream solder, and the cream solder melted is cooled for solidification. Then, the FPC 10 with the LED 3 mounted thereon is attached to the heat radiating plate 5a with the heat conductive tape placed between the rear side 10R of the FPC 10 and the heat radiating plate 5a. Thus, the light source region 30 is completed.

When the LED 3 is mounted on the FPC 10 by the heating reflow soldering method, the cream solder applied to the land 26 is melted and is caused to flow in the throughholes 41 by capillary action and wetting phenomenon. At this process, the electrode terminal 3a of the LED 3 is sucked toward the land 26 due to the interfacial tension of the melted cream solder (fillet effect), and consequently a sufficiently-thinned solder layer is formed between the electrode terminal 3a and the land 26 such that a substantially uniform solder layer thickness is achieved at the respective lands 26. At the same time, the throughhole 41 is filled with the solder 42 solidified.

Accordingly, the LED 3 can be solidly mounted on the FPC 10 ensuring a high precision for its height position from the FPC 10, and also heat generated by the LED 3 is adapted to efficiently conduct to the conductive pattern 7R at the rear side 10R of the FPC 10 through the electrode terminal 3a of the LED 3, and the solder 42 made of metallic material having a high heat conductance and contained in the throughhole 41, thus constituting an effective heat radiation pathway. Further, since a gap (air space) A provided between a surface 3b of the LED 3 facing the FPC 10 and the base film 6 of the FPC 10 is reduced, heat generated by the LED 3 and emitted from the surface 3b except the area covered by the electrode terminals 3a can be better conducted and radiated.

The throughhole 41 may be preferably formed with a circular cross section in view of workability but is not limited to the circular configuration. Also, the number and the arrangement of the throughhole 41 are not limited to those shown in FIGS. 1 and 2 and may be optimally determined considering various conditions for the process of mounting the LED 3.

A spread illuminating apparatus according to a second embodiment of the present invention will be described with reference to FIGS. 3 and 4. In explaining the example of FIGS. 3 and 4, any component parts corresponding to those in FIGS. 1 and 2 are denoted by the same reference numerals, and redundant explanations will be omitted below as appropriate.

Figure 3:
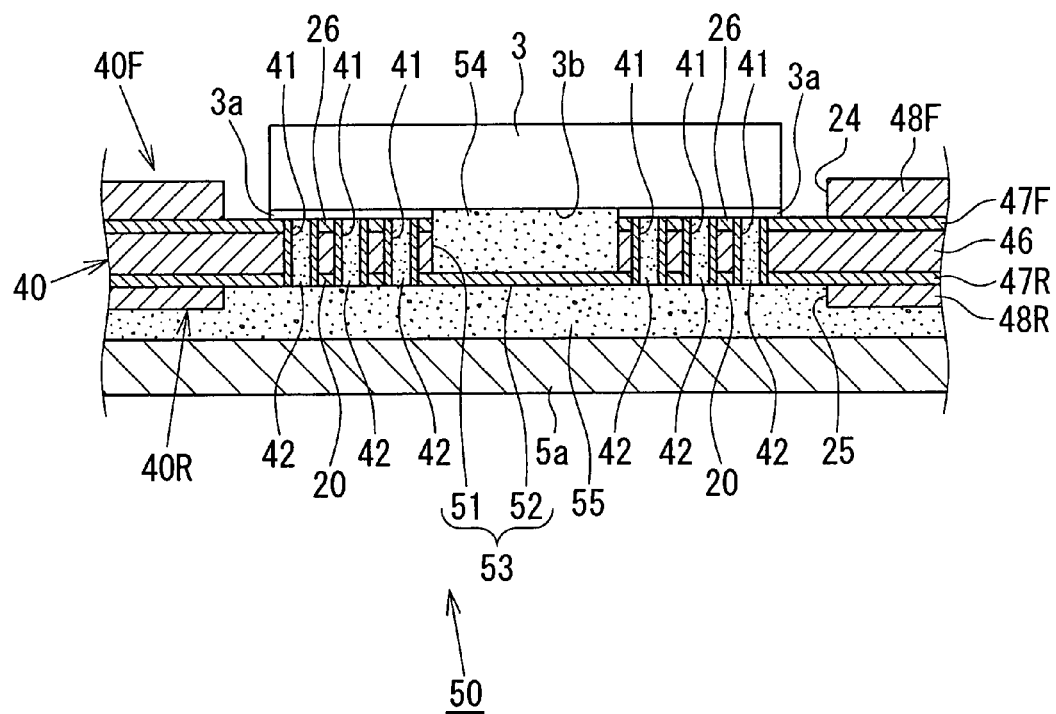
FIG. 3 is a cross sectional view of a point light source and a relevant portion of a double-sided FPC in a spread illuminating apparatus according to a second embodiment of the present invention.
Figure 4:
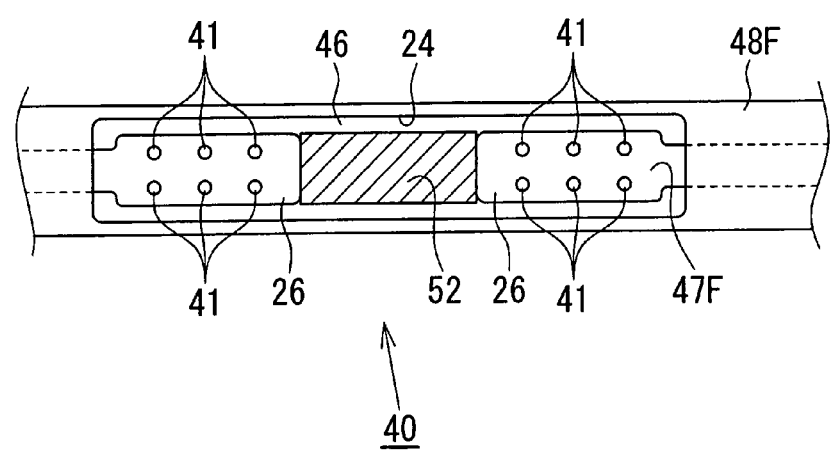
FIG. 4 is a top plan view of the double-sided FPC shown in FIG. 3, removing the point light source.

FIG. 3 shows a light source region 50 of the spread illuminating apparatus according to the second embodiment, and FIG. 4 shows a relevant portion of a double-sided flexible printed circuit board (FPC) 40. Referring to FIGS. 3 and 4, the FPC 40 includes the following members formed and structured basically in the same way as those of the FPC 10 shown in FIGS. 1 and 2: a base film 46; conductive patterns 47F and 47R; and a cover film 48F, and a cover film 48R (if necessary), wherein lands 26, a plurality of throughholes 41, solder 42, and conductive pattern sections 20 are formed and arranged in the substantially same way as those of the FPC 10.

In the second embodiment, a recess 53 is formed on a front side 40F of the FPC 40 at an area opposing a surface 3b of the LED 3 so as to provide a space 51, and the conductive pattern 47R on a rear side 40R of the FPC 40 is patterned except a portion 52 which constitutes the bottom of the recess 53. The light source region 50 according to the second embodiment includes a heat conductive resin 54 filled in the space 51 of the recess 53 closed by the surface 3b of the LED 3 mounted. And, an opening 25 is formed at a part of the cover film 48R on the rear side 40R so as to expose the portion 52 of the conductive pattern 47R. The rear side 40R of the FPC 40 is fixedly attached to a heat radiating plate 5a by a heat conductive tape 55 placed therebetween.

The heat conductive resin 54 is made of resin material having electrical insulation and a high heat conductance, for example, silicone resin composition, or any arbitrary and suitable resin component containing heat conductive and non-electrically conductive filler, such as alumina, aluminum nitride, silicon carbide, or the like. The heat conductive resin 54 is preferably composed of heat conductive substance which has a considerable flowability and does not require drying and solidifying processes, for example, silicone resin composition dispensed in oil, grease, or paste form. The heat conductive tape 55 is the same as the heat conductive tape used in the first embodiment.

A preferable manufacturing method of the light source region 50 of the second embodiment will be briefly described. The throughholes 41 at the land 26 (together with other throughholes necessary for electric conduction), and the conductive patterns 47F and 47R are formed in the same way as those of the light source region 30 according to the first embodiment. Then, the recess 53 is formed by a chemical etching method or like technique at a predetermined portion of the front side 40F of the FPC 40 so as to provide the space 51. And, the cover film 48F, and the cover film 48R (if required) are laminated respectively on the conductive patterns 47F and 47R in the same way as those of the light source region 30, thus the FPC 40 is completed. Then, the heat conductive resin 54 is filled into the space 51 defined by the recess 53, and the LED 3 is mounted onto the FPC 40 in the same way as in the manufacturing method for the light source region 30. Finally, the FPC 40 with the LED 3 mounted thereon is attached to the heat radiating plate 5a with the heat conductive tape 55 placed between the rear side 40R of the FPC 40 and the heat radiating plate 5a. Thus, the light source region 50 is completed.

The light source region 50 structured as described above according to the second embodiment, while achieving the same advantageous effects as the light source region 30 of the first embodiment, is provided with an additional heat radiation pathway covering from that LED 3 to the heat radiating plate 5a, which is constituted by the heat conductive resin 54, the portion 52 of the conductive pattern 47R at the bottom of the recess 53, and the heat conductive tape 55, whereby a better heat radiation efficiency is achieved.

The process of filling the heat conductive resin 54 into the space 51 is performed immediately before mounting the LED 3 onto the FPC 40, and if the mounting equipment is provided with a resin filling function, then the resin filling process can be implemented in the process of mounting LED 3, thus significantly enhancing the workability of the resin filling process. Also, since the heat conductive resin 54 filled in the space 51 of the recess 53 is held therein by means of the surface 3a of the LED 3 mounted, the subsequent process of attaching the FPC 40 to the heat radiating plate 5a can be duly implemented without worrying about the migration and attachment of the heat conductive resin 54 to the other members, and the workability of the process can be significantly enhanced. This also allows use of a heat conductive resin that is excellent in flowability and therefore is favorable in adhering and filling characteristics.

The amount of the heat conductive resin 54 to be filled into the space 51 before the process of mounting the LED 3 needs to be determined based on the dimension between the conductive pattern 47F of the FPC 40 and the surface 3a of the LED 3 so that the heat conductive resin 54 projects appropriately beyond the conductive pattern 47F so as to duly make contact with the surface 3a. In this regard, in the light source region 50 according to the second embodiment, the solder layer formed between the land 26 and the surface 3a has its thickness sufficiently reduced and made substantially uniform between the respective lands 26, so the amount of the heat conductive resin 54 can be easily controlled so as to ensure an appropriate contact with the surface 3b of the LED 3.

While the present invention has been illustrated and explained with respect to specific embodiments thereof, it is to be understood that the present invention is by no means limited thereto. For example, the spread illuminating apparatuses according to the first and second embodiments have been described as having a basic structure same as that of the spread illuminating apparatus of FIG. 5, but may alternatively be structured such that the FPC with the point light source mounted thereon is arranged in a plane orthogonal to the light inlet surface of the light conductor plate. Also, solder may not have to be filled in all the throughholes formed at the land of the FPC, insofar as the point light source can be appropriately mounted on the FPC as intended.

Therefore, it will be understood by those skilled in the art that various changes in form and details may be made therein without departing from the spirit and scope of the invention as defined by the appended claims.

What is claimed is:

1. A spread illuminating apparatus comprising:
   a light conductor plate;
   a point light source disposed at a side surface of the light conductor plate; and
   a printed circuit board having a pair of lands formed on a front side thereof in which the pair of lands is provided so as to communicate with a conductive pattern and having the point light source mounted on the front side, wherein
   the point light source is attached to the pair of lands through electrode terminals of the point light source, each of the electrode terminals being sandwiched between the point light source and one of the lands,
   a throughhole is formed in each of the lands,
   solder is contained at least partly in the throughholes,
   a recess is formed between the pair of lands on the front side of the printed circuit board,
   a bottom of the recess is defined by a portion of the conductive pattern, and
   heat conductive resin is filled in a space defined by the recess and a surface of the point light source facing the printed circuit board.

2. A spread illuminating apparatus according to claim 1, wherein the printed circuit board is a double-sided printed circuit board which defines the front side having the point light source and a rear side opposite to the front side, and a conductive pattern section of the conductive pattern on the rear side is formed at at least an area of the rear side having the throughholes and communicates with a plated coating provided at a wall in each of the throughholes.

3. A method of making a spread illuminating apparatus, the method comprising:
   mounting a point light source on a front side of a printed circuit board;
   forming a pair of lands on the front side of the printed circuit board so as to communicate with a conductive pattern;
   attaching the point light source to the pair of lands through electrode terminals of the point light source, each of the electrode terminals being sandwiched between the point light source and one of the lands,
   forming a throughhole in each of the lands,
   disposing solder at least partly in the throughholes,
   forming a recess between the pair of lands on the front side of the printed circuit board, a bottom of the recess being defined by a portion of the conductive pattern,
   filling heat conductive resin in a space defined by the recess and a surface of the point light source facing the printed circuit board, wherein
   filling the solder contained in the throughholes thereinto during a heating process is implemented by a heating reflow soldering method, and
   the point light source is disposed at a side surface of a light conductor plate.

* * * * *